US010069011B2

(12) United States Patent
Bouche

(10) Patent No.: US 10,069,011 B2
(45) Date of Patent: Sep. 4, 2018

(54) METHOD FOR FABRICATING A FINFET METALLIZATION ARCHITECTURE USING A SELF-ALIGNED CONTACT ETCH

(71) Applicant: GLOBALFOUNDRIES INC., Grand Cayman (KY)

(72) Inventor: Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/728,615

(22) Filed: Oct. 10, 2017

(65) Prior Publication Data

US 2018/0138308 A1 May 17, 2018

Related U.S. Application Data

(62) Division of application No. 15/349,358, filed on Nov. 11, 2016, now Pat. No. 9,818,876.

(51) Int. Cl.
*H01L 29/76* (2006.01)
*H01L 29/78* (2006.01)
*H01L 29/66* (2006.01)

(52) U.S. Cl.
CPC ...... *H01L 29/785* (2013.01); *H01L 29/66795* (2013.01); *H01L 29/7848* (2013.01)

(58) Field of Classification Search
CPC .............. H01L 29/785; H01L 29/7848; H01L 29/66795
See application file for complete search history.

(56) References Cited

U.S. PATENT DOCUMENTS

| 2011/0188288 | A1* | 8/2011 | Minami | G11C 11/22 365/145 |
| 2013/0292777 | A1* | 11/2013 | Liaw | G11C 11/412 257/369 |
| 2014/0110755 | A1* | 4/2014 | Colinge | H01L 29/41791 257/192 |
| 2015/0295087 | A1* | 10/2015 | Cheng | H01L 29/7851 257/192 |
| 2016/0071774 | A1 | 3/2016 | Wei et al. | |
| 2016/0141423 | A1* | 5/2016 | Diaz | H01L 29/78618 257/329 |
| 2016/0254261 | A1* | 9/2016 | Machkaoutsan | H01L 21/321 257/369 |
| 2017/0054005 | A1* | 2/2017 | Lam | H01L 27/2436 |
| 2017/0077031 | A1* | 3/2017 | Lu | H01L 23/535 |
| 2017/0084461 | A1* | 3/2017 | Colinge | H01L 21/3085 |

* cited by examiner

*Primary Examiner* — Victor A Mandala
(74) *Attorney, Agent, or Firm* — Scully Scott Murphy and Presser; Frank DiGiglio

(57) ABSTRACT

A method of fabricating a FinFET device includes a self-aligned contact etch where a source/drain contact module is performed prior to a replacement metal gate (RMG) module. In particular, the method involves forming a sacrificial gate over the channel region of a fin, and an interlayer dielectric over adjacent source/drain regions of the fin. An etch mask is then used to protect source/drain contact regions and enable the removal of the interlayer dielectric from outside of the protected area, e.g., between adjacent fins.

4 Claims, 13 Drawing Sheets

METHOD FOR FABRICATING A FINFET METALLIZATION ARCHITECTURE USING A SELF-ALIGNED CONTACT ETCH

BACKGROUND

The present application relates generally to methods for forming semiconductor devices, and more specifically to methods for forming fin field effect transistors (FinFETs) having a reduced risk of electrical shorts between gate and source/drain contacts.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted short circuits between adjacent conductive elements.

In advanced node FinFET devices, for instance, the proximity of gate contacts and source/drain contacts may lead to unwanted conduction, i.e., leakage, between these adjacent structures, particularly at the respective top and bottom portions of the structures. Short circuits can adversely affect yield.

SUMMARY

It is therefore desirable to develop semiconductor device architectures and methods for fabricating device architectures that have a decreased propensity for unwanted short circuits between adjacent conductive elements, such as between adjacent gate and source/drain contacts.

In accordance with various embodiments, a method of forming a FinFET device includes forming a semiconductor fin having first and second source/drain regions and a channel region therebetween, and forming a source/drain junction over each source/drain region of the fin. An isolation layer is formed adjacent to the semiconductor fin, and a first dielectric layer is formed over the source/drain junctions and over the isolation layer.

The method further involves forming a masking layer covering the first dielectric layer over the source/drain junctions, and removing the first dielectric layer from over the isolation layer to form cavities, which are filled with a second dielectric layer. A gate stack is then formed over the channel region of the semiconductor fin, and the first dielectric layer is removed from over the source/drain junctions selective to the second dielectric layer such that conductive contacts are formed in electrical contact with the source/drain junctions.

In further embodiments, a FinFET device includes a semiconductor fin having first and second source/drain regions and a channel region therebetween. A source/drain junction is disposed over each of the source/drain regions, and a conductive contact is in electrical contact with each of the source/drain junctions, where the conductive contact includes a conductive liner and a contact layer disposed over the conductive liner. The device further includes a gate stack in electrical contact with the channel region, where the gate stack includes a gate dielectric disposed over the channel region and a gate conductor disposed over the gate dielectric. In the device, a top surface of the gate conductor is co-planar with a top surface of the contact layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
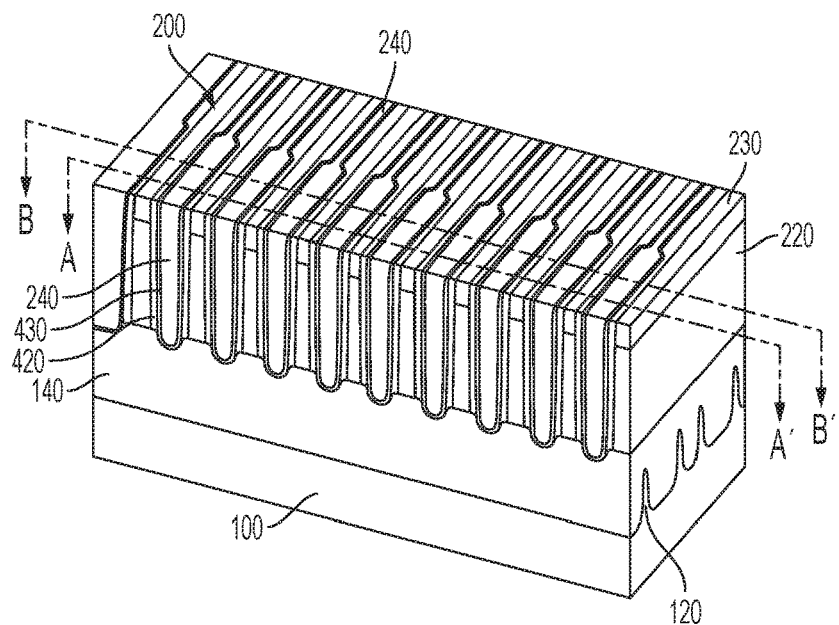
FIG. 1 is a schematic perspective diagram of a planarized FinFET device at an intermediate stage of fabrication having a plurality of sacrificial gates separated by spacers and overlying an array of semiconductor fins.

Reference will now be made in greater detail to various embodiments of the subject matter of the present application, some embodiments of which are illustrated in the accompanying drawings. The same reference numerals will be used throughout the drawings to refer to the same or similar parts.

As used herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Disclosed in various embodiments is a method of manufacturing a FinFET device where a source/drain contact module and an associated self-aligned contact etch are performed prior to a replacement metal gate (RMG) module. In particular, the method involves forming a sacrificial gate over the channel region of a fin, and an interlayer dielectric between adjacent sacrificial gates and over source/drain regions of the fin. An etch mask is then used to protect source/drain contact regions and enable the removal of the interlayer dielectric from outside of the protected area, e.g., over non-contacted regions of the device, between adjacent fins.

The cavities formed by removing the interlayer dielectric are back-filled with a dielectric layer having etch selectivity with respect to the interlayer dielectric. The sacrificial gate is then replaced with a functional gate, including a gate conductor and optional gate cap, and then the remaining (previously-protected) interlayer dielectric over the source/drain contact locations is removed selective to the back-filled dielectric material and replaced with source/drain contacts. A "functional gate" refers to a structure used to control output current (i.e., the flow of carriers through a channel) of a semiconductor device using an electrical field or, in some instances, a magnetic field.

In various embodiments, the disclosed process involves reactive ion etching an interlayer dielectric over non-contacted regions of the device architecture and wet etching the interlayer dielectric to form contact openings over source/drain contact locations. The process sequence avoids erosion of the gate cap (if present) and gate conductor by the source/drain contact etch and the associated propensity to thereby create a short circuit between the gate contact and an adjacent source/drain contact. In various embodiments, self-aligned contacts are formed without recessing the metal gate. Methods for forming the FinFET device using a self-aligned contact etch are described herein with reference to FIGS. 1-9.

Referring to FIG. 1, semiconductor fins 120 are formed over a semiconductor substrate 100. Electrical isolation between and over the fins 120 is provided by shallow trench isolation layer 140, which may comprise an oxide such as silicon dioxide. The semiconductor substrate 100 may be a bulk substrate or a composite substrate such as a semiconductor-on-insulator (SOI) substrate.

Semiconductor substrate 100 may comprise a semiconductor material such as silicon (Si) or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. The substrate 100 is not limited to silicon-containing materials, however, as the substrate 100 may comprise other semiconductor materials, including Ge and compound semiconductors such as GaAs, InAs and other like semiconductors. Portions of the semiconductor substrate 100 may be amorphous, polycrystalline, or single crystalline.

In various embodiments, fins 120 comprise a semiconductor material such as silicon, and may be formed by patterning and then etching the semiconductor layer of an SOI substrate or a top portion of a bulk semiconductor substrate. The etching process typically comprises an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

In further embodiments, the fins 120 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins.

As used herein, a "fin" refers to a contiguous semiconductor material that includes a pair of vertical sidewalls that are parallel to each other. The fins 120 are formed from any suitable semiconductor material and may comprise, for example, single crystal Si, single crystal germanium, single crystal silicon germanium (SiGe), and the like. The term "single crystalline" denotes a crystalline solid in which the crystal lattice of the entire solid is substantially continuous and substantially unbroken to the edges of the solid with substantially no grain boundaries.

As used herein, a surface is "vertical" if there exists a vertical plane from which the surface does not deviate by more than three times the root mean square roughness of the surface. Each of a plurality of fins 120 can comprise a single crystal semiconductor material that extends along a lengthwise direction (L). As used herein, a "lengthwise direction" is a horizontal direction along with an object extends the most. A "widthwise direction" (W) is a horizontal direction that is perpendicular to the lengthwise direction.

In various embodiments, the as-formed fins 120 are free-standing, i.e., supported only by the substrate 100. Each fin has a height (H) that may range from 10 nm to 100 nm and a width (W) that may range from 4 nm to 30 nm. Other heights and widths that are less than or greater than the ranges mentioned can also be used. Plural fins may have identical or substantially identical dimensions, i.e., height and/or width. As used herein, substantially identical dimensions vary by less than 10%, e.g., less than 5%, 2% or 1%. The fins 120 may have an aspect ratio (H/W) ranging from 1 to 5, e.g., 1, 1.5, 2, 3, 4 or 5, including ranges between any of the foregoing values.

The semiconductor fins 120 may be doped, un-doped, or contain doped and un-doped regions therein. Each doped region within the semiconductor fins 120 may have the same or different doping concentrations and/or conductivities. Doped regions that are present can be formed, for example, by ion implantation, gas phase doping, diffusion from epitaxy, or by dopants that are present in the material used to form the fins. For instance, fins 120 may be formed from the semiconductor layer of an SOI substrate, which may comprise a dopant prior to forming the fins. By way of example, fins 120 may be uniformly doped and have a dopant concentration in the range of $1\times10^{15}$ atoms/cm$^3$ to $1\times10^{18}$ atoms/cm$^3$.

In various embodiments, each of a plurality of semiconductor fins 120 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

In structures comprising plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. Such plural fins are typically oriented parallel to each other and perpendicular to the library logic flow of a circuit. After fin formation, a fin cut or fin removal process may be used to eliminate unwanted fins or portions thereof from the particular circuit or device being fabricated. Thus, the fin-to-fin periodicity may be constant or variable over an array of fins.

Referring still to FIG. 1, shown is a perspective, post-planarization view of a FinFET device at an intermediate stage of fabrication. The device includes a fin array comprising a plurality of parallel fins 120 formed over a semiconductor substrate 100. An insulating material such as flowable silicon dioxide is deposited to cover the fins 120 and form a shallow trench isolation layer 140.

Arranged orthogonal to and straddling the fins 120 are plural sacrificial gate stacks 200, which include a sacrificial gate 220 and a sacrificial gate cap 230. In various embodiments, the sacrificial gate 220 comprises amorphous silicon (a-Si) and the sacrificial gate cap 230 comprises a nitride material such as silicon nitride. Sidewall spacers 420 and a conformal liner 430 are successively formed over sidewalls of the gate stacks, and an interlayer dielectric 240 such as silicon dioxide is deposited between adjacent sacrificial gate stacks, i.e., over the conformal liner 430.

Figure 2:
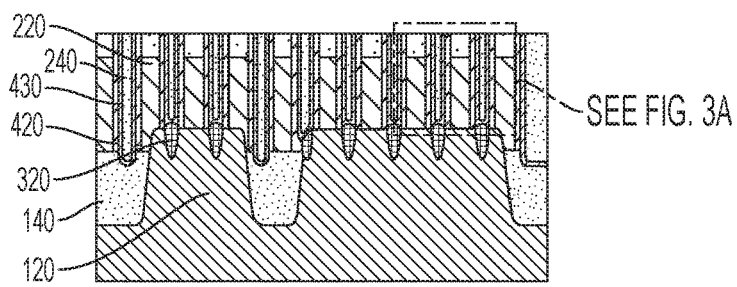
FIG. 2 is a cross-sectional view of the structure of FIG. 1 taken along line A-A' parallel to and coincident with a semiconductor fin.
Figure 3A:
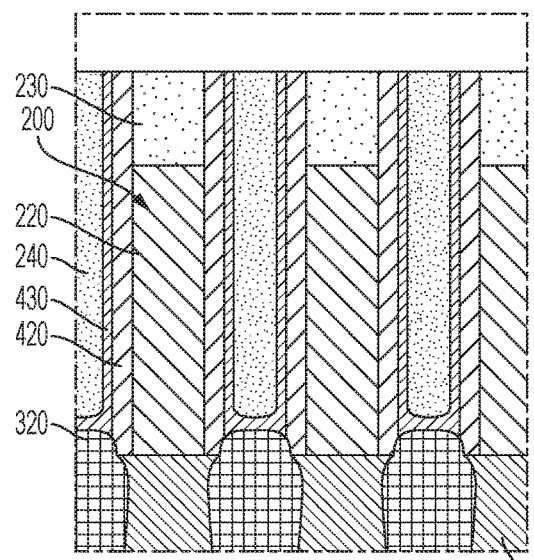
FIG. 3A is a magnified view of a portion of FIG. 2.

FIG. 2 is a cross-sectional view of the structure of FIG. 1 taken along line A-A' parallel to and coincident with a semiconductor fin 120, which has been segmented by a prior fin-cut etch. FIG. 3A is an enlarged view of a portion of FIG. 2, detailing the location of the sacrificial gates 220 over channel portions of the fin 120. The views of FIGS. 2 and 3A are aligned with source/drain contact locations over source/drain junctions 320. Each of the views in FIGS. 3A-9A are taken along the A-A' cross-section of FIG. 1.

Source/drain junctions 320 may be formed by ion implantation or selective epitaxy following formation of the sacrificial gate stacks 200 and sidewall spacers 420, but in various embodiments prior to depositing the conformal liner 430 and the interlayer dielectric 240, optionally using the sacrificial gate stacks 200 and sidewall spacers 420 as an alignment mask.

According to various embodiments, source/drain junctions 320 are formed by selective epitaxy into self-aligned cavities that are defined within the fins between the sacrificial gate stacks 200. Thus, according to certain embodiments, source/drain junctions are at least partially embedded within the fins 120. Source/drain junctions 320 may comprise silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

The source/drain junctions 320 and corresponding (i.e., underlying) source/drain regions of the fin 120 may be doped, which may be performed in situ, i.e., during epitaxial growth, or following epitaxial growth, for example, using ion implantation. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

For instance, if a plurality of semiconductor fins 120 are doped with dopants of a first conductivity type, the plurality of source/drain junctions can be doped with dopants of a second conductivity type, which is the opposite of the first conductivity type. If the first conductivity type is p-type, the second conductivity type is n-type, and vice versa. By way of example, a dopant region is implanted with arsenic or phosphorus to form an n-type region. In another example, a dopant region is implanted with boron to form a p-type region. The dopant concentration within the source/drain junctions 320 may range from $1\times10^{19}$ atoms/cm$^3$ to $1\times10^{22}$ atoms/cm$^3$.

An optional drive-in anneal can be used to diffuse dopant species and generate a desired dopant profile. In certain embodiments, dopant atoms within the source/drain junctions 320 may be diffused into the semiconductor fins 120 using a post-epitaxy or post-implantation anneal (e.g., at a temperature of 600° C. to 1400° C.) to create a desired dopant profile within the fins proximate to the source/drain junctions 320.

In the illustrated embodiment, sidewalls spacers 420 are disposed over sidewalls (vertical surfaces) of the sacrificial gate stacks 200, and conformal liner 430 is disposed over the sidewall spacers 420 as well as over a top surface of the source/drain junctions 320. The conformal liner 430 is adapted to function as a contact etch stop layer (CESL).

Sidewall spacers 420 may be formed by blanket deposition of a spacer material (e.g., using atomic layer deposition) followed by a directional etch such as reactive ion etching (RIE) to remove the spacer material from horizontal surfaces. In certain embodiments, the sidewall spacer 420 thickness is 4 to 20 nm, e.g., 4, 10, 15 or 20 nm, including ranges between any of the foregoing values.

Conformal liner 430 may be formed by blanket deposition of a suitable contact etch stop material (e.g., using atomic layer deposition). As seen with reference to FIG. 3A, within the source/drain contact locations, the conformal liner 430 is formed over the sidewall spacers 420 as well as over the source/drain junctions 320. In certain embodiments, the conformal liner 430 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon nitride.

In various embodiments, the sidewall spacer 420 and the conformal liner 430 are formed from materials that can be etched selectively to one another. In particular embodiments, the sidewall spacer 420 comprises SiOCN and the conformal liner (i.e., contact etch stop layer) 430 comprises silicon nitride.

Figure 3B:
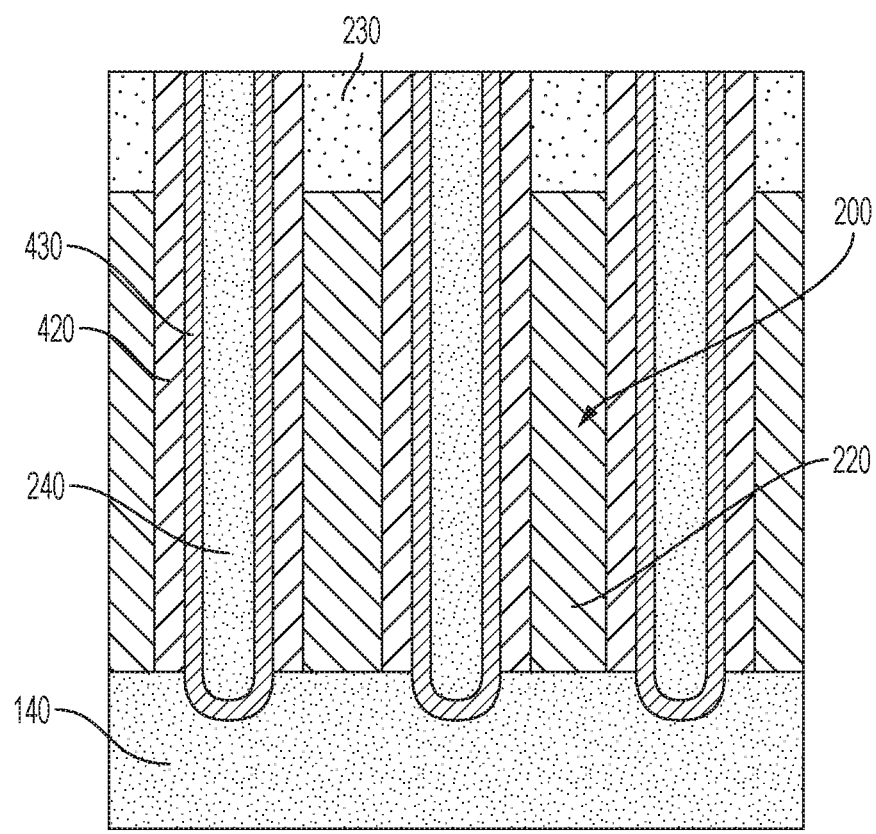
FIG. 3B is a cross-sectional magnified view of the structure of FIG. 1 taken along line B-B' parallel to, but between adjacent semiconductor fins.

FIG. 3B is a cross-sectional view of the structure of FIG. 1 taken along line B-B' parallel to, but between adjacent semiconductor fins. Thus, the FIG. 3B view is out of plane from the source/drain junctions 320 and associated source/drain contact locations, and illustrates a non-contacted region. Within the non-contacted region, sacrificial gate stack 200 is disposed over shallow trench isolation layer 140, i.e., sacrificial gate 220 is disposed directly over shallow trench isolation layer 140, and conformal liner 430 separates the interlayer dielectric 240 from the shallow trench isolation layer 140. It will be appreciated that each of the views in FIGS. 3B-9B are taken along the B-B' cross-section of FIG. 1.

As seen with reference to FIGS. 3A and 3B, interlayer dielectric 240 is disposed between adjacent sacrificial gate stacks 200, i.e., directly over the conformal liner 430. The interlayer dielectric 240 may comprise any dielectric material including, for example, oxides, nitrides or oxynitrides. In one embodiment, the interlayer dielectric 240 includes silicon dioxide. In various embodiments, the interlayer dielectric may be self-planarizing, or the top surface of the interlayer dielectric 240 can be planarized by chemical mechanical polishing (CMP) using the sacrificial gate cap 230 as a polish stop.

"Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. In the post-planarization structure of FIG. 1, sacrificial gate stack 200 is exposed, and will be replaced with a functional gate during subsequent processing.

Referring now to FIGS. 4-9, a series of patterning and selective etch steps are used to discriminate between source/drain contact regions and non-contacted regions within the device architecture, i.e., non-trench silicide, self-aligned contact (SAC) patterning. Specifically, patterning and etching processes are used to initially protect source/drain contact regions and remove the interlayer dielectric 240 from unprotected regions of the device. The interlayer dielectric 240 within the unprotected, non-contacted regions is replaced by an etch-selective dielectric refill layer 620, which allows source/drain contact openings to be defined by a further oxide etch following a replacement metal gate module.

In certain embodiments, the self-aligned contact etch and replacement metal gate modules may be preceded by a gate cut module, where the sacrificial gate stack is removed locally and replaced with a nitride material, which during the replacement metal gate module will facilitate creation of electrical discontinuity in a given functional gate.

Figure 4:
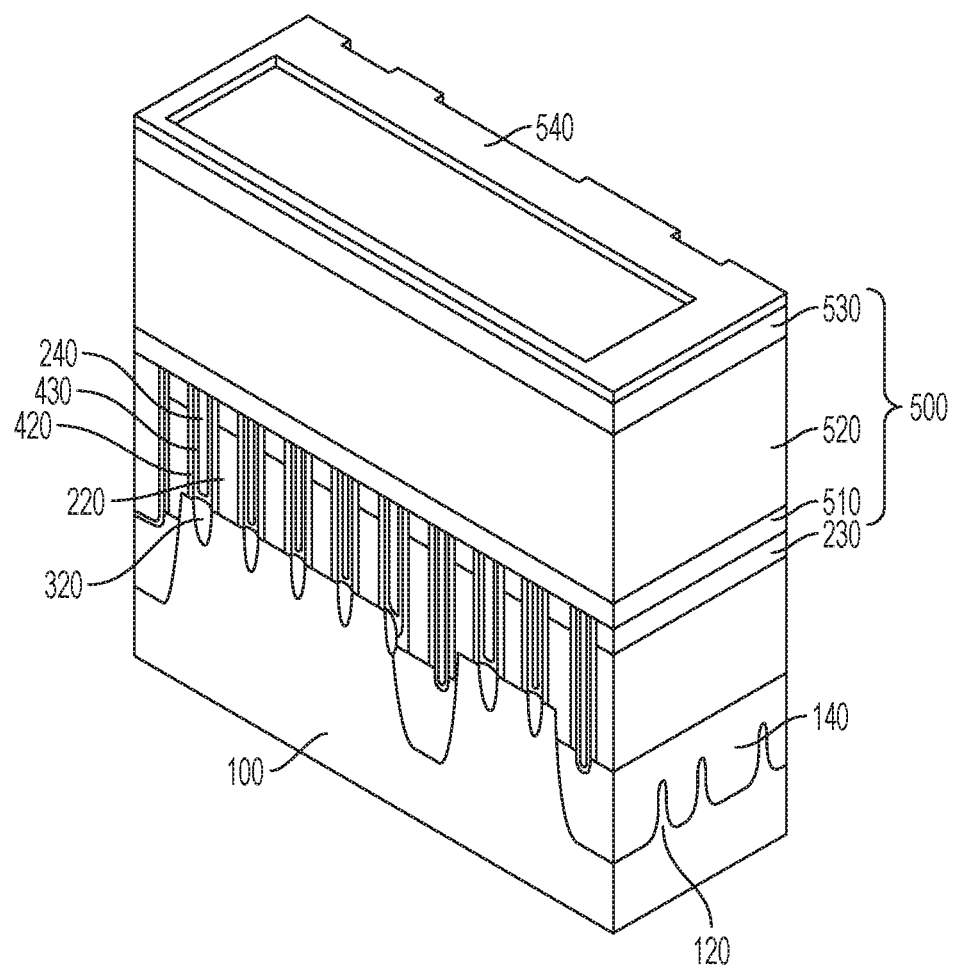
FIG. 4 is a perspective view showing a multi-patterning architecture according to various embodiments disposed over the structure of FIG. 1.

Referring to FIG. 4, a block mask 500 is formed over the planarized structure of FIG. 1. In the illustrated embodiment, block mask 500 is a softmask and comprises, from top to bottom, a memorization (e.g., oxide) layer 540, a nitride layer 530, an amorphous carbon layer 520, and an oxide layer 510. The block mask 500 and memorization layer 540 are adapted to facilitate multiple exposures and the definition of sub-micron structures, such as during a double-patterning lithography (DPL) process. Although various embodiments use a block mask to define gate contact locations and source/drain contact locations, it will be appreciated that individual lithography stacks can be used to pattern the device architecture.

Figures 4A, 4B:
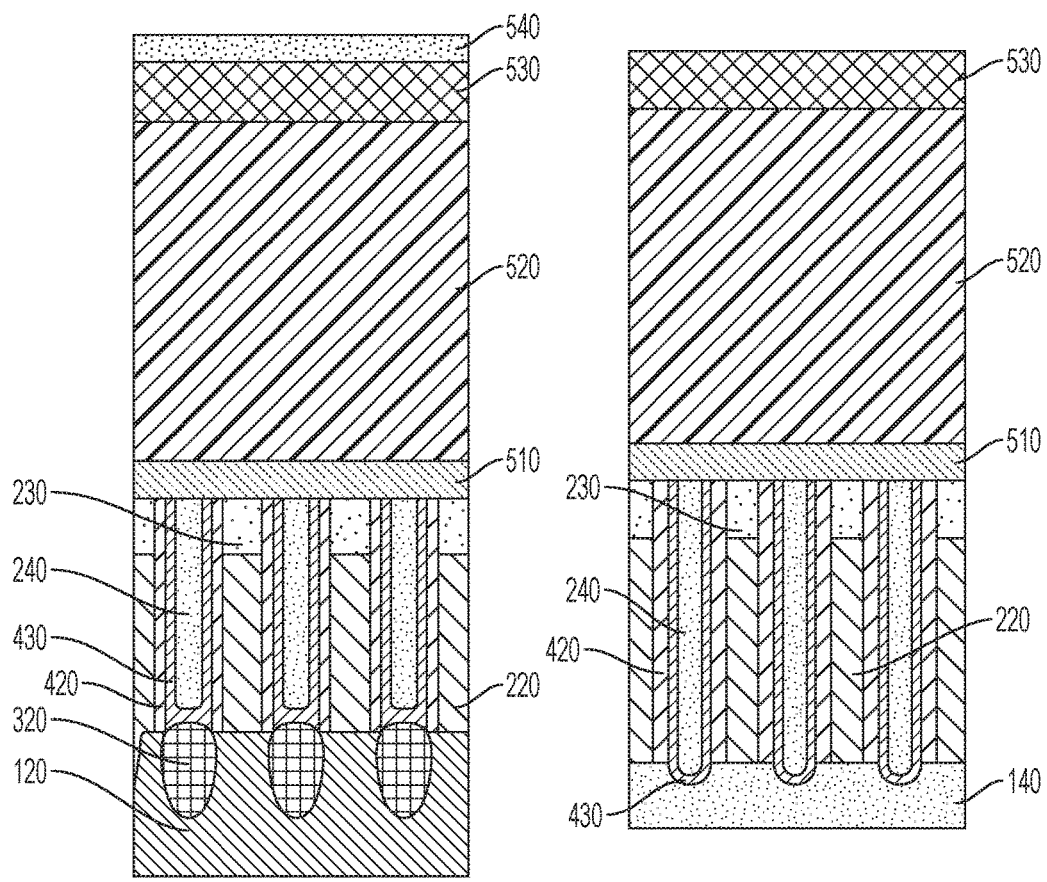
FIG. 4A is a cross-sectional view of a multi-patterning architecture used to block a portion of the FIG. 1 structure over source/drain junctions of the FinFET device.
FIG. 4B is a cross-sectional view of the multi-patterning architecture not blocking a portion of the FIG. 1 structure between adjacent fins over a shallow trench isolation layer of the FinFET device.

As shown in FIGS. 4 and 4A, block mask 500 is configured to cover one or more source/drain contact locations of the device. That is, referring to FIG. 4A, memorization layer 540 is disposed over source/drain junctions 320. As shown in FIGS. 4 and 4B, other portions of the device, such as between fins 120 and over shallow trench isolation layer 140, are uncovered by memorization layer 540.

Figure 5:
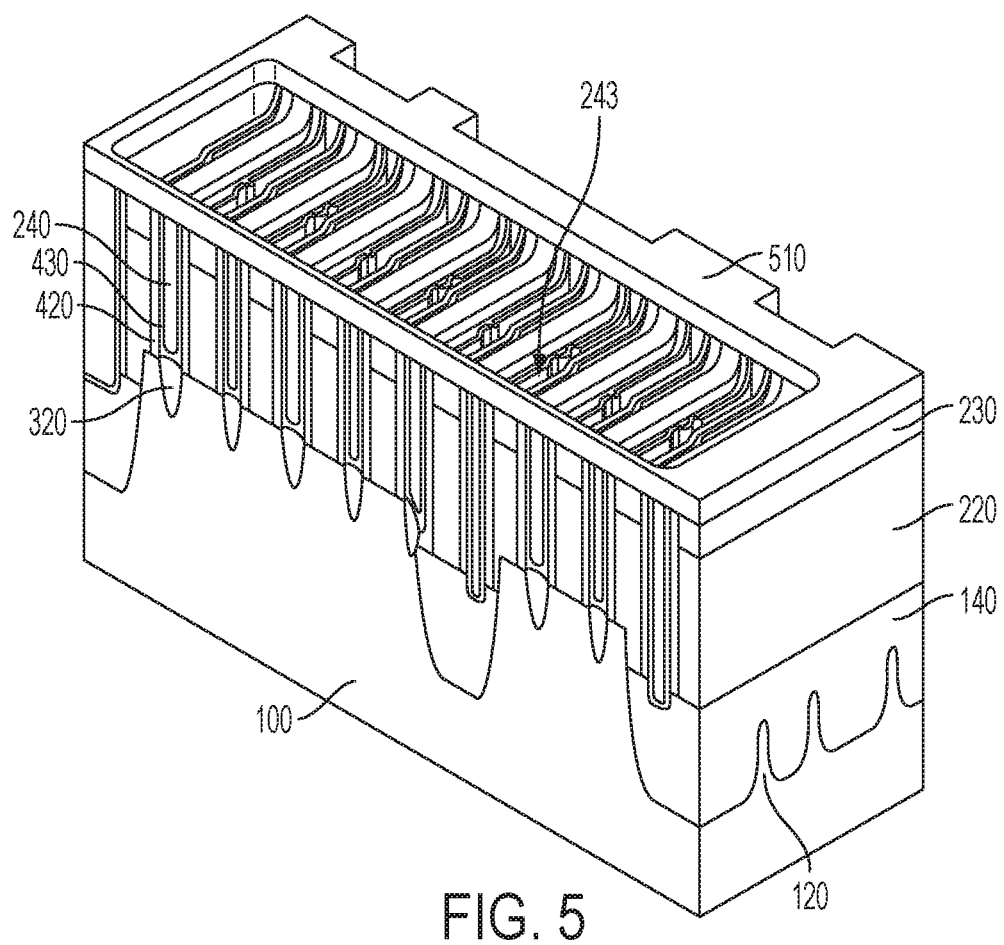
FIG. 5 is a post-etch perspective view showing selective removal of an interlayer dielectric (ILD) from unblocked regions.
Figure 5A:
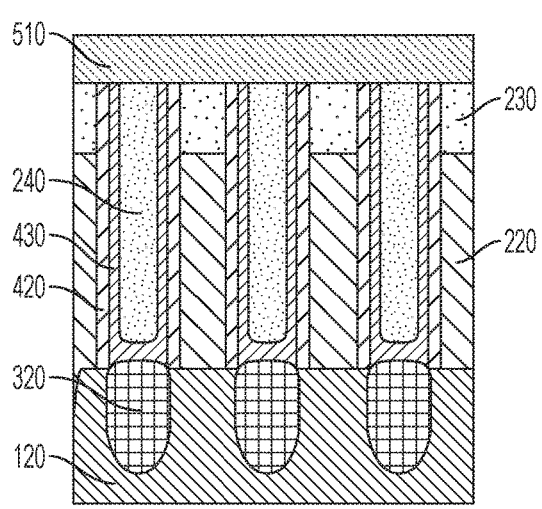
FIG. 5A is a post-etch cross-sectional view showing retention of the blocked interlayer dielectric over source/drain junctions.
Figure 5B:
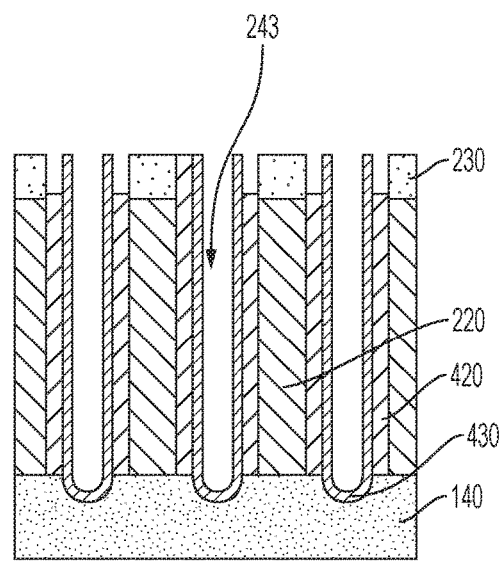
FIG. 5B is a post-etch cross-sectional view showing removal of the unblocked interlayer dielectric from within non-contacted regions over the shallow trench isolation layer between semiconductor fins.

An etch step is used to remove unmasked portions of the interlayer dielectric 240. Referring to FIG. 5A, masked portions of the interlayer dielectric 240 overlying source/drain contact locations are un-etched. However, as seen with reference to FIG. 5B, portions of the interlayer dielectric 240 not covered by the memorization layer 540 are removed, for example by reactive ion etching, to expose the conformal liner 430 within cavities 243. The conformal liner 430 functions as an etch stop and prevents etching of the shallow trench isolation layer 140. In the illustrated embodiment, the sacrificial gate cap 230 and/or conformal liner 430 may be partially eroded during the etch step used to remove the interlayer dielectric 240 from within the non-contacted regions. Etching the interlayer dielectric 240 within non-contacted regions obviates potential etch damage to the source/drain junctions 320, which remain protected by the interlayer dielectric within the source/drain contact locations.

Following removal of unmasked portions of the interlayer dielectric 240, or in part concurrently with but without compromising the masking functionality, memorization layer 540, nitride layer 530, amorphous carbon layer 520, and oxide layer 510 can be removed.

Figure 6:
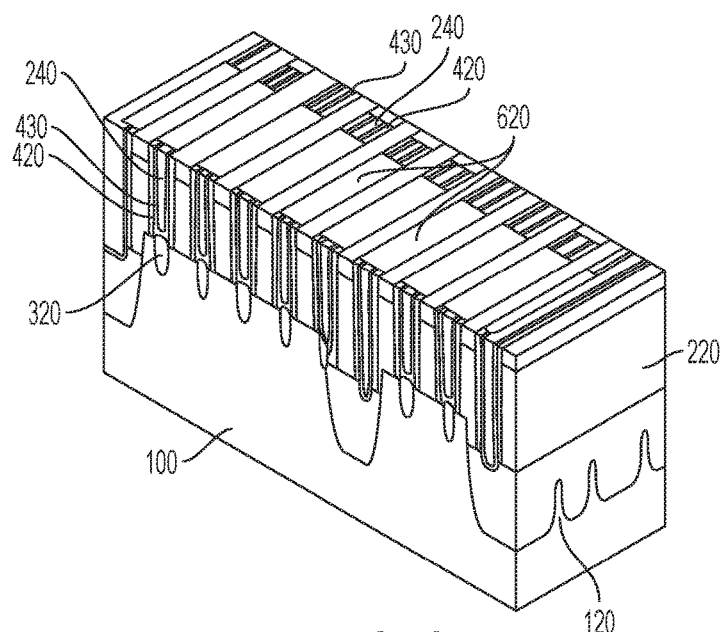
FIG. 6 depicts a post-planarization architecture after back-filling the etched interlayer dielectric with an etch-selective dielectric fill layer.

FIG. 6 depicts a post-planarization architecture after filling cavities 243 over non-contacted regions with a refill layer 620. Refill layer 620 and interlayer dielectric 240 can be etched selectively to one another. Thus, refill layer 620 enables the subsequent removal of the interlayer dielectric 240 over source/drain contact locations without a further masking step, i.e., using an etch that is selective to the refill layer 620. An example refill layer 620 comprises a carbon-doped oxide, such as silicon oxycarbide (SiOC), which is deposited in locations where source/drain contacts are not to be formed.

Figure 6A:
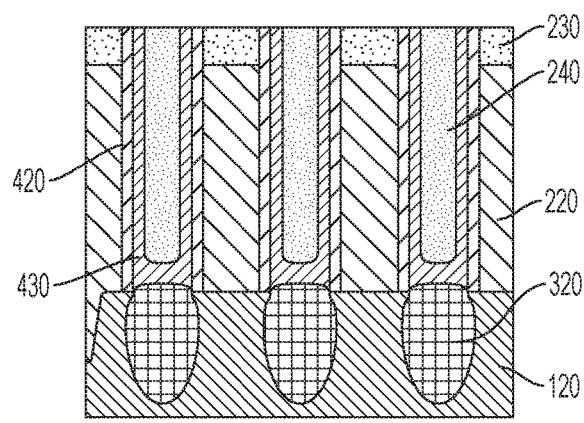
FIG. 6A is the sacrificial gate structure of FIG. 6 showing retention of the interlayer dielectric over source/drain junctions after back-filling with the dielectric fill layer.
Figure 6B:
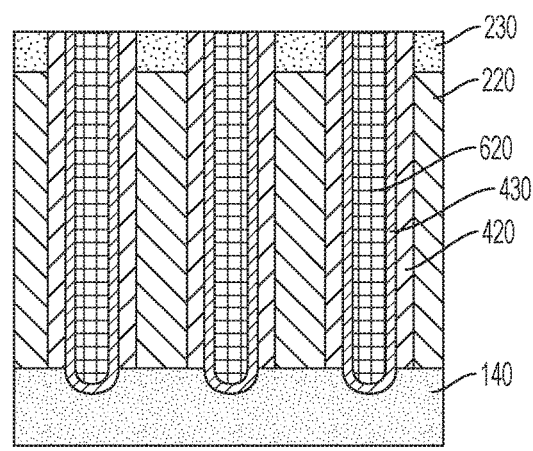
FIG. 6B is a cross-sectional view of the sacrificial gate structure of FIG. 6 between source/drain junctions showing the introduction of the etch-selective dielectric layer between adjacent sacrificial gates and over non-contacted regions of the device.

FIG. 6A shows the un-etched interlayer dielectric 240 of FIG. 6 remaining over source/drain junctions 320, and FIG. 6B shows the sacrificial gate structure of FIG. 6 after back-filling cavities 243 between adjacent sacrificial gate stacks 200 and laterally spaced from the source/drain junctions with refill layer 620. Polishing of the refill layer 620 can be performed via CMP using the sacrificial gate cap 230 as a polish stop to form a planarized structure as seen in FIG. 6. A CMP step can also remove any residual block mask 500, such as oxide layer 510. At this stage of fabrication, interlayer dielectric 240 is disposed between sacrificial gate stacks 200 over source/drain junctions 320, i.e., over source/drain contact locations, and the refill layer 620 is disposed between sacrificial gate stacks 200 where source/drain contacts will not be formed, e.g., between adjacent fins 120.

Figure 7:
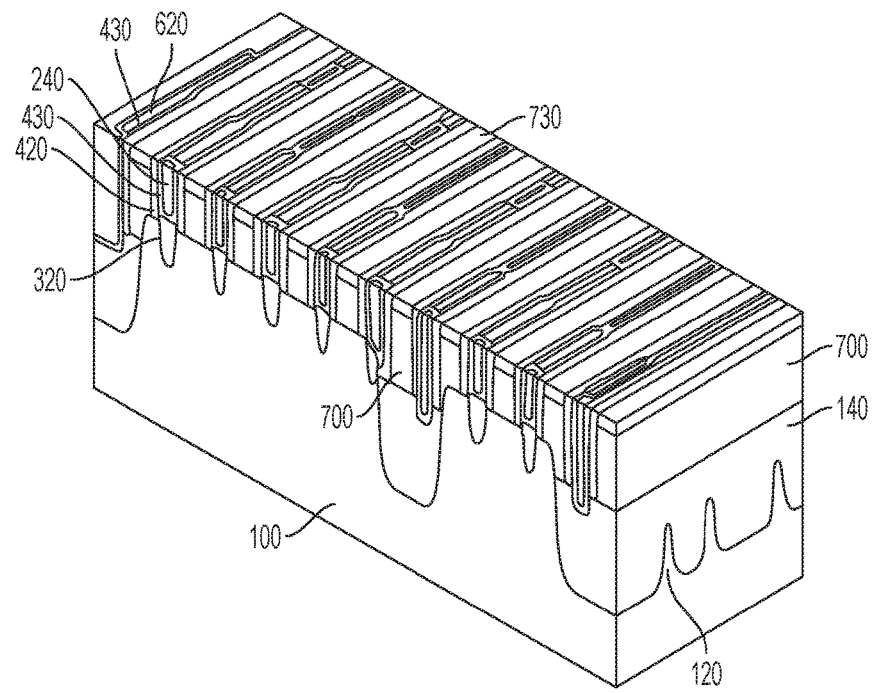
FIG. 7 is a perspective view of the FinFET architecture following a replacement metal gate (RMG) module.

Referring to FIG. 7, a replacement metal gate (RMG) module includes removal of sacrificial gate stack 200, including sacrificial gate 220 and sacrificial gate cap 230, and the subsequent formation of a gate stack 700 over the top and sidewall surfaces of the channel region of fin 120.

The gate stack 700 includes a conformal gate dielectric formed directly over the exposed top and sidewall surfaces of the fin, and a gate conductor formed over the gate dielectric. For clarity, the gate dielectric and gate conductor layers are not separately shown.

The gate dielectric may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

The gate conductor may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including a work function metal layer and/or a conductive liner. In certain embodiments, the gate conductor comprises a titanium nitride (TiN) layer directly over the gate dielectric and a tungsten or cobalt fill layer over the titanium nitride layer.

Figures 7A, 7B:
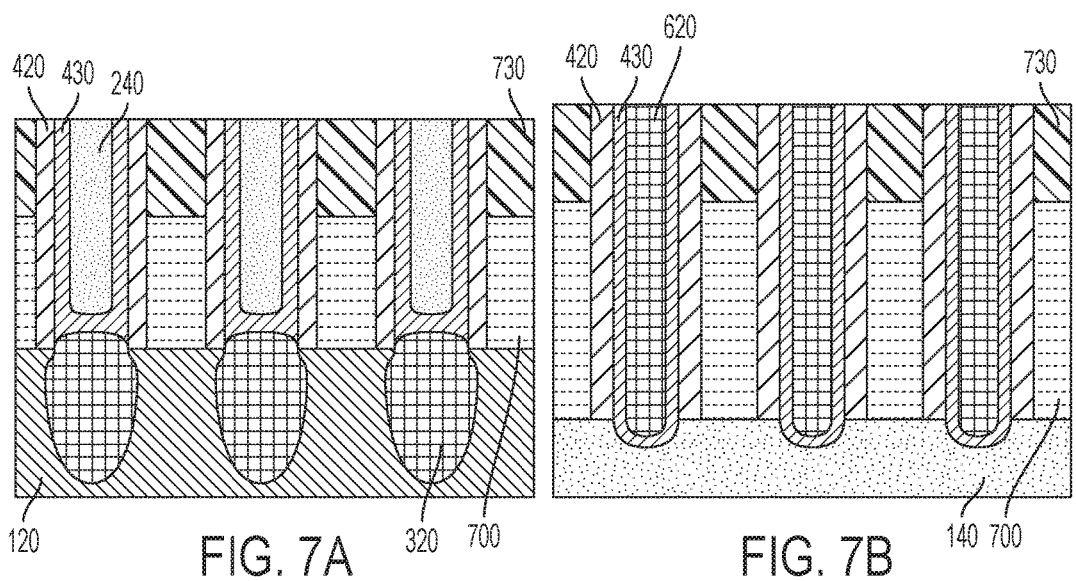
FIG. 7A shows the formation of a metal gate and corresponding gate cap over a channel region of the illustrated fin between source/drain junctions.
FIG. 7B shows the formation of the metal gate and gate cap over the shallow trench isolation layer between fins.

FIGS. 7A and 7B illustrate gate stacks 700 disposed over respective the channel regions of fin 120. In the illustrated embodiment, the gate stacks 700 alternately pass between the interlayer dielectric 240 disposed over source/drain junctions 320 and refill layer 620 disposed over the shallow trench isolation layer 140 between adjacent fins.

Following deposition of the gate stack 700, the structure can be polished to remove the overburden in a manner known to those skilled in the art. Optionally, the gate stack 700, including gate dielectric and gate conductor layers, can be recessed using one or more selective etch steps to form openings that are backfilled with a gate cap 730. For instance, one or more reactive ion etch steps can be used to recess the gate stack. In certain embodiments, 25% to 75% of the original gate height is removed by the recess etch.

The gate cap 730 may comprise a nitride material such as silicon nitride or silicon oxynitride (SiON). Following deposition of the gate cap 730, a further planarization process may be used to remove the overburden and, as shown in FIGS. 7A and 7B, complete the replacement metal gate module and form a planarized structure.

In certain embodiments, in the planarized structure, a top surface of the gate cap 730 and respective top surfaces of the interlayer dielectric 240, sidewall spacers 420, and contact etch stop layer 430 are mutually co-planar over source/drain contact locations, and a top surface of the gate cap 730 and respective top surfaces of the fill layer 620, sidewall spacers 420, and contact etch stop layer 430 are mutually co-planar over the shallow trench isolation layer between adjacent fins. It will be appreciated that the gate stack geometry over the fin 120 in FIG. 7A is comparable to the gate stack geometry over the shallow trench isolation (STI) region 140 in FIG. 7B.

Figure 8:
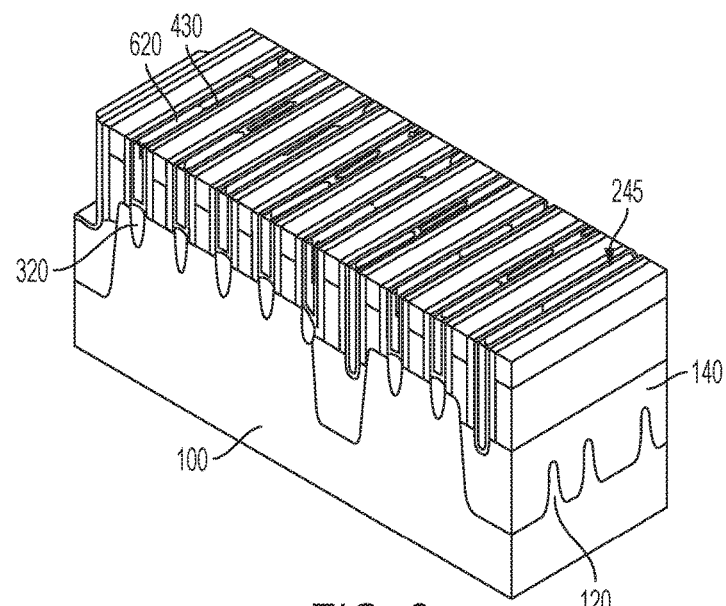
FIG. 8 is a perspective view showing the selective formation of cavities over source/drain junctions.

Referring to FIG. 8, following the RMG module, the remaining interlayer dielectric 240 can be removed. Removal of the remaining interlayer dielectric 240 from over source/drain junctions 320 can be performed using an etch that is selective to the refill layer 620 and the gate cap 730, preserving the conformal liner 430 and the sidewall spacers 420. For instance, in various embodiments, a wet etch comprising hydrofluoric acid (HF) can be used. Hydrofluoric acid or a solution comprising dilute hydrofluoric acid can be used to etch the remaining interlayer dielectric 240, i.e., over source/drain contact locations, selectively to a carbon-doped oxide (e.g., SiOC).

Figure 8A:
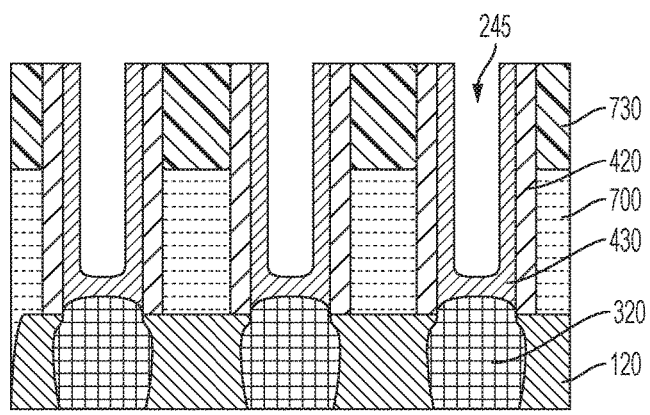
FIG. 8A depicts the selective removal of the interlayer dielectric to form cavities over source/drain junctions of the FinFET architecture.
Figure 8B:
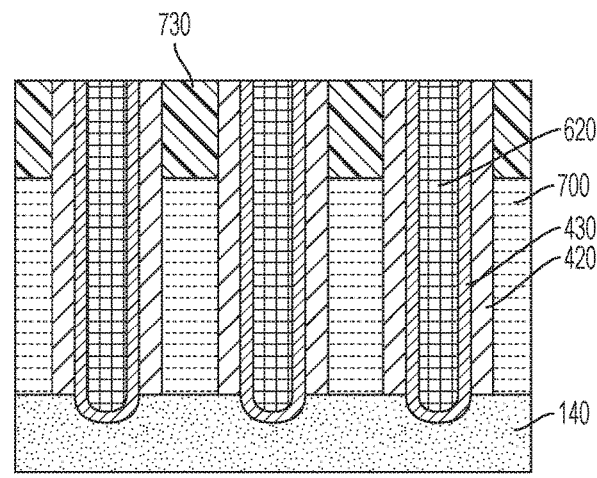
FIG. 8B depicts the retention of the etch-selective dielectric fill layer between adjacent gates over non-contacted regions of the device.

FIG. 8A depicts the selective removal of the interlayer dielectric to form cavities 245 over source/drain junctions 320, while FIG. 8B depicts the retention of the refill layer 620 over the shallow trench isolation layer 140 between adjacent gates.

Figure 9:
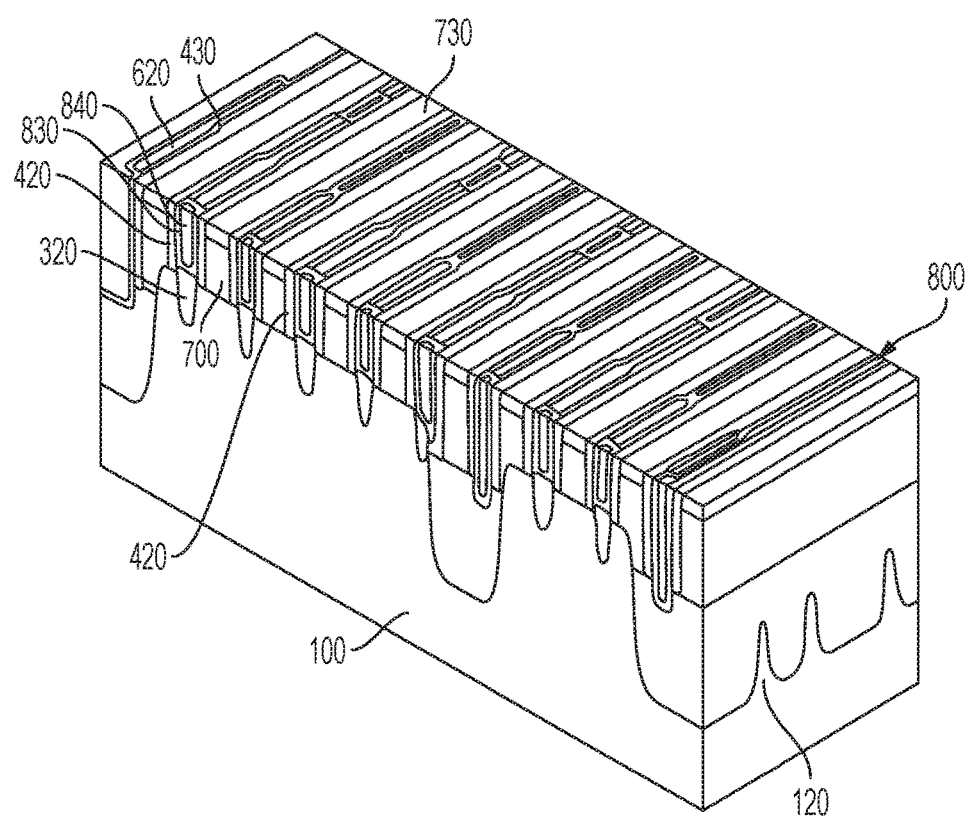
FIG. 9 is a perspective view of the FinFET architecture following a contact metallization module.
Figure 9A:
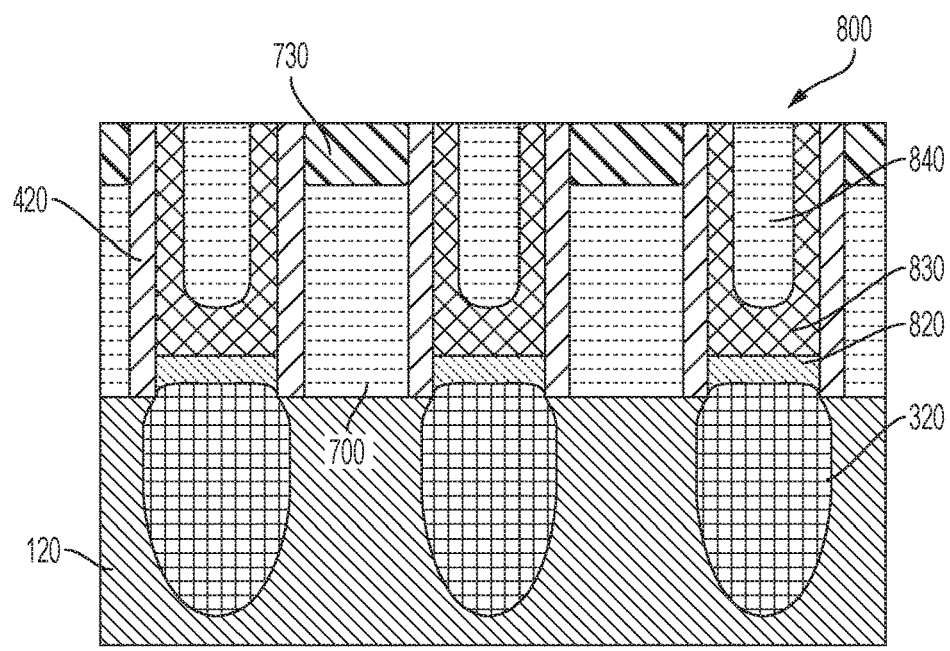
FIG. 9A shows the formation of source/drain contacts within the cavities of FIG. 8A.

Then, referring to FIG. 9, and in particular FIG. 9A, the conformal liner 430 can be removed from over the source/drain junctions 320 to form self-aligned contact openings for forming source/drain contacts. The conformal liner 430 can be removed by a reactive ion etch or isotropic plasma etch, for example. Although removal of the conformal liner 430 may remove a portion of gate cap 730 and/or sidewall spacers 420, in various embodiments the gate cap 730 is of sufficient thickness to protect the underlying gate stack 700.

Referring to FIG. 9A, a conductive contact 800 is formed within the contact openings and over exposed surfaces of the source/drain junctions 320 by depositing, for example, a conductive liner 830, typically titanium (Ti), and then filling the contact openings with a barrier such as titanium nitride (TiN) and a contact layer 840 such as tungsten or cobalt, for example. Conductive contacts 800 may include a metal that forms an ohmic contact with the source/drain junctions 320. A silicide layer 820 (e.g., titanium silicide) may be formed in situ via reaction between the conductive liner 830 and the source/drain junctions 320 to form a trench silicide contact.

Figure 9B:
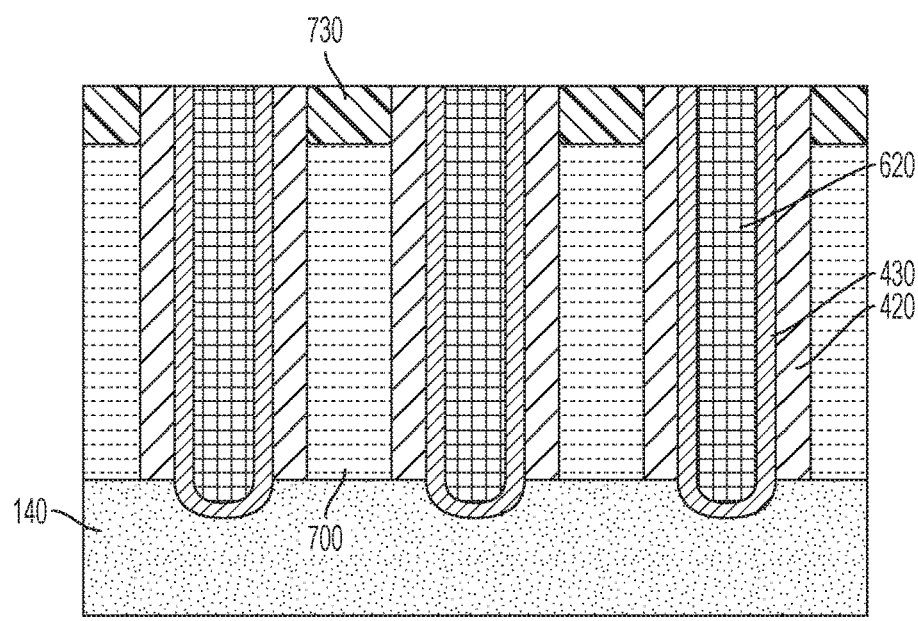
FIG. 9B shows the post-contact metallization module structure over the ILD layer between adjacent fins.

FIGS. 9A and 9B shows the architecture of FIGS. 8A and 8B after deposition of liner layer 830 and barrier plus contact fill layer 840 over and in electrical contact with source/drain junctions 320. After formation of the conductive contacts 800, a planarization process may be used to form a planarized structure where, for example, a top surface of the conductive contacts 800 is co-planar with a top surface of the gate stacks 700.

Figure 10A:
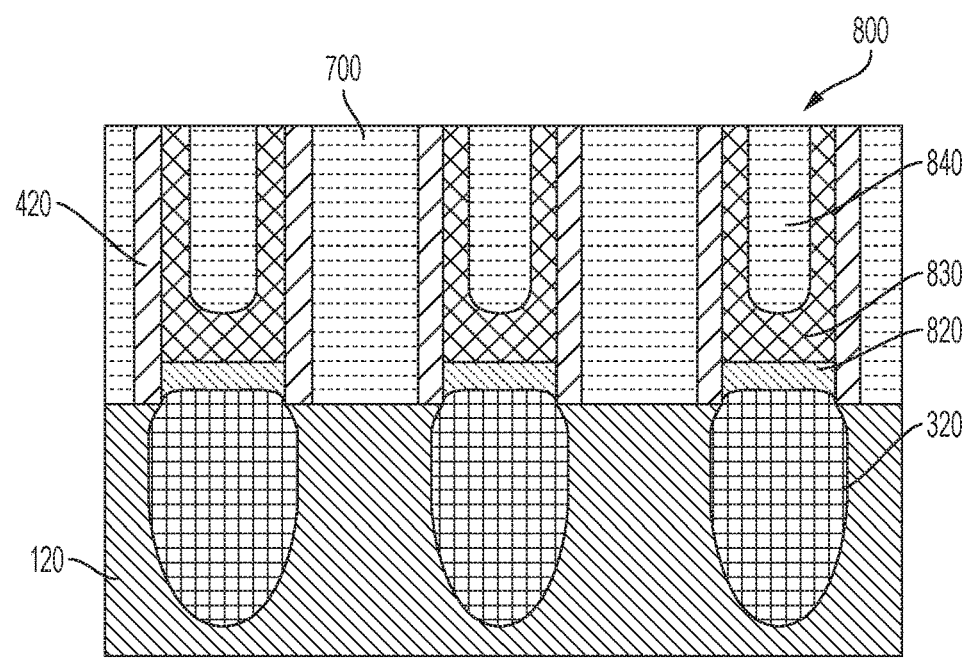
FIG. 10A is a cross-sectional view of a device architecture according to alternate embodiments having an un-recessed gate disposed over source/drain junctions.
Figure 10B:
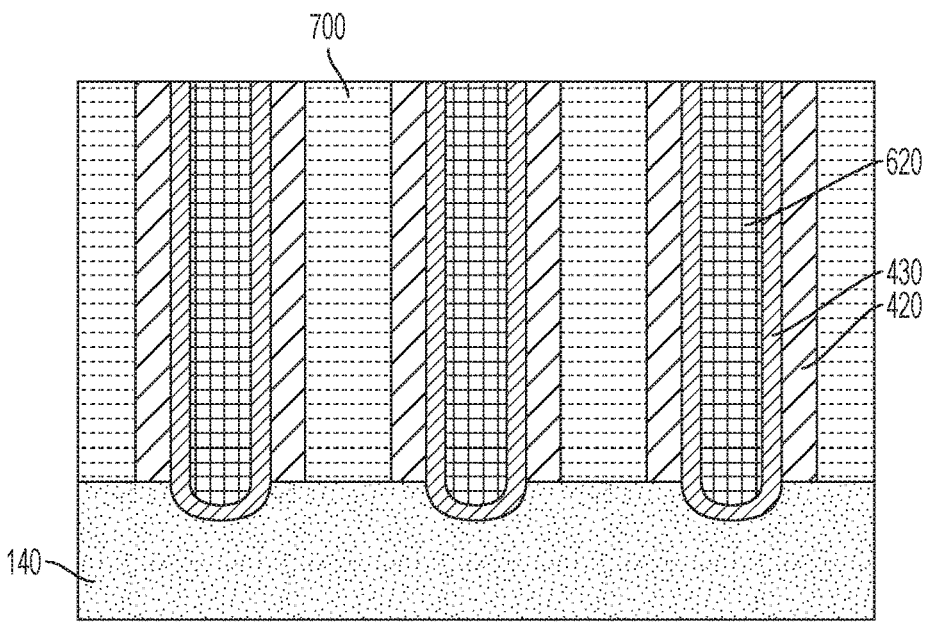
FIG. 10B shows the formation of an un-recessed metal gate over the ILD layer between fins.

FIGS. 10A and 10B illustrate a FinFET architecture according to alternate embodiments where the gate stack 700 is not recessed during or after the RMG module and a gate cap is not formed. The use of a wet etch to define cavities 245 over source/drain junctions 320 enables the optional omission of the gate recess step and gate cap. As in the gate cap embodiment, however, a CMP step can be used to planarize a top surface of the structure.

In the illustrated structure, a top surface of the gate stack 700 and respective top surfaces of the contact metallization 800 and sidewall spacers 420 are mutually co-planar over source/drain contact locations (FIG. 10A), and a top surface of the gate stack 700 and respective top surfaces of the fill layer 620, contact etch stop layer 430, and sidewall spacers 420 are mutually co-planar over the shallow trench isolation layer between adjacent fins (FIG. 10B).

Figure 11:
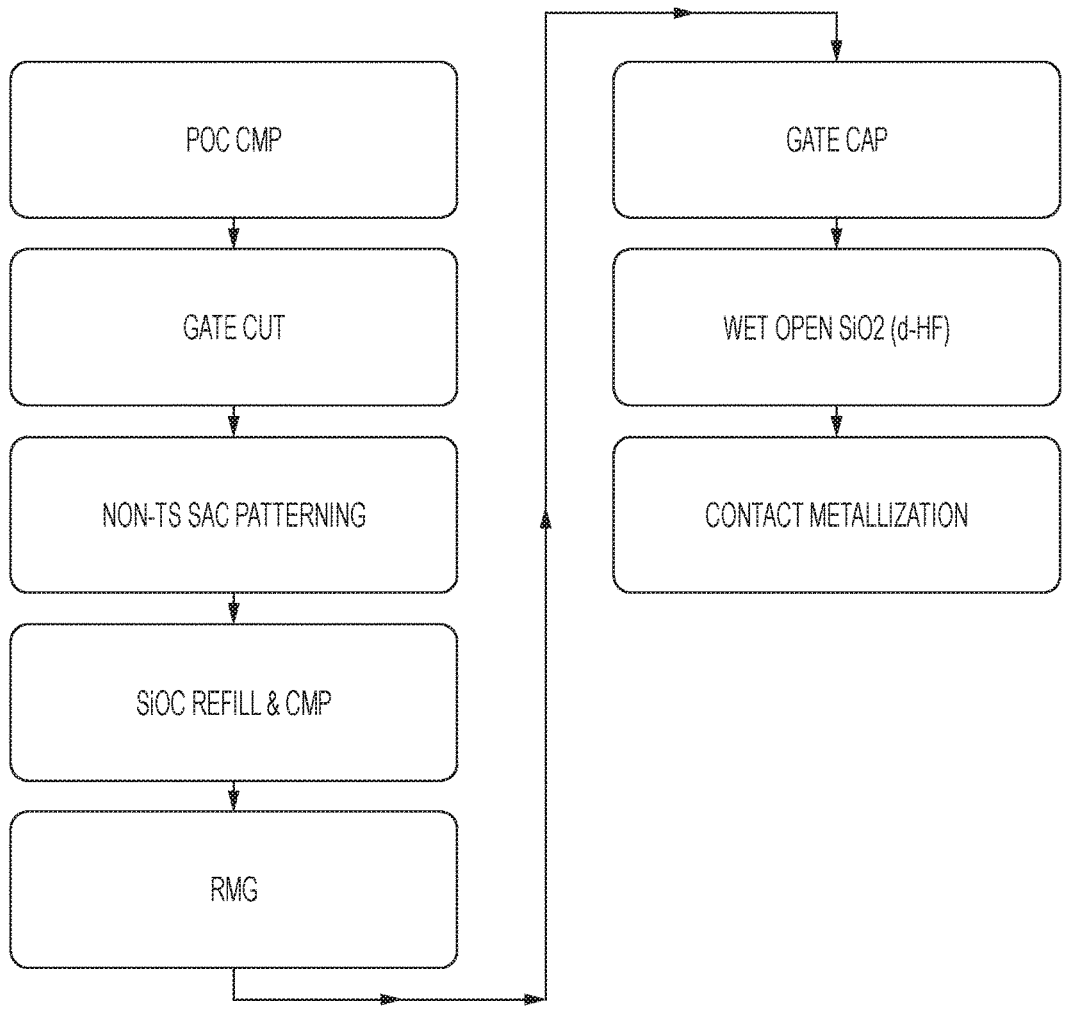
FIG. 11 is a flow chart detailing an example process for forming a FinFET device using a self-aligned contact (SAC) etch.

An example process for forming a FinFET device is outlined in the flowchart shown in FIG. 11. According to several embodiments, a poly open CMP module precedes a gate cut module. Non-trench silicide, self-aligned contact (SAC) patterning, SiOC refill and CMP steps follow and precede a replacement metal gate (RMG) module and optional gate cap module. Then, source/drain contacts are opened with a wet etch and filled with suitable contact metallization.

The disclosed self-aligned contact etch provides a robust metallization architecture with a decreased likelihood of inter-contact electrical short circuits. Integrated circuits fabricated with the instant method exhibit improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a spacer that comprises silicon nitride include embodiments where a spacer consists essentially of silicon nitride and embodiments where a spacer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A FinFET device, comprising:
    a semiconductor fin having first and second source/drain regions and a channel region therebetween;
    a source/drain junction disposed over each of the source/drain regions;
    a conductive contact in electrical contact with each of the source/drain junctions, the conductive contact comprising a conductive liner and a contact layer disposed over the conductive liner;
    a gate stack in electrical contact with the channel region, the gate stack comprising a gate dielectric disposed over the channel region and a gate conductor disposed over the gate dielectric, wherein a top surface of the gate conductor is co-planar with a top surface of the contact layer; and
    a sidewall spacer is disposed between the conductive contact and the gate stack, wherein the conductive liner is disposed directly over a first sidewall surface of the sidewall spacer, and the gate dielectric is disposed directly over a second sidewall surface of the sidewall spacer opposite the first sidewall surface.

2. The FinFET device of claim 1, wherein a top surface of the sidewall spacer is co-planar with the top surface of the gate conductor and the top surface of the contact layer.

3. The FinFET device of claim 1, wherein the source/drain junctions comprise an epitaxial layer.

4. A FinFET device, comprising:
    a semiconductor fin having first and second source/drain regions and a channel region therebetween;
    a source/drain junction disposed over each of the source/drain regions;
    a conductive contact in electrical contact with each of the source/drain junctions, the conductive contact comprising a conductive liner and a contact layer disposed over the conductive liner;
    a gate stack in electrical contact with the channel region, the gate stack comprising a gate dielectric disposed over the channel region and a gate conductor disposed over the gate dielectric, wherein a top surface of the gate conductor is co-planar with a top surface of the contact layer; and a sidewall spacer is disposed between the conductive contact and the gate stack, wherein a top surface of the sidewall spacer is co-planar with the top surface of the gate conductor and the top surface of the contact layer.

* * * * *